United States Patent
Moon

(10) Patent No.: US 6,924,603 B2
(45) Date of Patent: Aug. 2, 2005

(54) HYBRID ELECTRO LUMINESCENCE PANEL AND DRIVING METHOD THEREOF

(75) Inventor: Seong-Hak Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 232 days.

(21) Appl. No.: 10/237,739

(22) Filed: Sep. 10, 2002

(65) Prior Publication Data
US 2003/0059525 A1 Mar. 27, 2003

(30) Foreign Application Priority Data
Sep. 21, 2001 (KR) ........................................ 2001-58635

(51) Int. Cl.[7] .............................................. G09G 3/10
(52) U.S. Cl. ........................ 315/169.3; 345/214; 345/77
(58) Field of Search ................................. 315/161, 167, 315/169.3; 345/205–206, 55, 76, 80, 214, 77

(56) References Cited

U.S. PATENT DOCUMENTS

| 5,189,549 A | * | 2/1993 | Leventis et al. ............ 359/271 |
| 5,304,895 A | * | 4/1994 | Ujihara ......................... 315/72 |
| 5,444,330 A | * | 8/1995 | Leventis et al. ............. 313/506 |
| 5,739,180 A | * | 4/1998 | Taylor-Smith ............... 523/203 |
| 6,140,765 A | * | 10/2000 | Kim et al. ................... 313/506 |
| 6,184,968 B1 | * | 2/2001 | Taylor-Smith ............... 349/158 |
| 6,271,812 B1 | * | 8/2001 | Osada et al. ................... 345/76 |
| 6,580,223 B2 | * | 6/2003 | Konishi et al. ........... 315/169.3 |

FOREIGN PATENT DOCUMENTS

JP        10-012378        * 1/1998

* cited by examiner

Primary Examiner—Thuy V. Tran
(74) Attorney, Agent, or Firm—Fleshner & Kim, LLP

(57) ABSTRACT

A hybrid electro luminescence (EL) panel and a driving method thereof using advantages of an organic EL panel and inorganic EL panel. The panel includes a first substrate having a luminescent substance formed with an organic substance, and a second substrate having a luminescent substrate formed with an inorganic substance. Further, the first substrate and the second substrate are overlapped with each other, and thereby, a brightness can be improved, the panel can be scaled up, a life span of the panel is increased, and a color balance can be controlled easily.

40 Claims, 7 Drawing Sheets

LIGHT DIRECTION

HYBRID ELECTRO LUMINESCENCE PANEL AND DRIVING METHOD THEREOF

BACKGROUND OF THE INVENTION

1. Field of the Invention

The present invention relates to an electro luminescence (EL) panel, and particularly, to a hybrid electro luminescence panel having characteristics such as high brightness, a large size, long life span, and easy control of color balance using advantages of an organic EL and an inorganic EL.

2. Description of the Background Art

Generally, an electronic display device is an electric device for changing electric information signals outputted from various electric devices to light information signals which are visible.

The electronic display device is able to display the light information signals as patterned information such as numbers, characters, figures, and pictures (hereinafter, referred to as image), and can be divided into an emissive display device displaying the light information signal by self-emission, and a non-emissive display device display the light information signal by controlling peripheral lights such as reflection, dispersion, and interference phenomenon.

There are the emissive display devices such as field emission display (FED), vacuum fluorescent display (VFD), electro luminescence (EL), and plasma display panel (PDP), and there are the non-emissive display devices such as liquid crystal display (LCD), and electro chromic display (ECD).

The EL device among above various electronic display devices is one of the most highlighted devices.

The EL device has a structure that a phosphor is inserted between two electrodes, and it is the display device using a phenomenon that electrons released from the electrodes when a voltage is applied are crashed to the phosphor to generate charge and discharge and to emit the light.

The EL device can be divided into an organic EL device and an inorganic EL device according to materials used and structure.

FIG. 1 is an exemplary view showing a cell structure of a general inorganic EL device.

As shown therein, the inorganic EL device comprises: a phosphor layer 7 formed between a transparent electrode 11 and a rear electrode 3; a lower insulating layer 5 and an upper insulating layer 9 formed on upper and lower parts of the phosphor layer 7 respectively; and a glass substrate 13 formed on rear surface of the transparent electrode 11. Herein, the upper and lower insulating layers 9 and 5 are formed using dielectric substances. Therefore, when the voltage is applied from outer side, the upper and lower insulating layers 9 and 5 have predetermined capacitance values.

A luminescent layer 7 is formed using inorganic substances such as ZnS and Mn. The rear electrode 3 is formed using conductive substance such as Al. Herein, the rear electrode 3 is used as a scan electrode for supplying a scan pulse to the cells 1. The transparent electrode 11 is formed by a transparent conducting substance such as indium-tin-oxide (ITO). Herein, the transparent electrode 11 is used as a data electrode for supplying data to the cells 1.

After that, when the voltage is applied between the rear electrode 3 and the transparent electrode 11, a hole is accelerated toward the rear electrode 3 and the electron is accelerated toward the transparent electrode 11. Therefore, the electron and the hole are crashed into each other on center portion of the emissive layer 7, and thereby visible light is generated to display a predetermined image.

FIG. 2 is an exemplary view showing a cell structure of a general organic EL device.

As shown therein, the organic EL device comprises: a metal electrode 23 and a transparent electrode 35; a luminescent layer 29 formed between the metal electrode 23 and the transparent electrode 35; an electron injecting layer 25 and an electron transporting layer 27 formed between the luminescent layer 29 and the metal electrode 23; and a hole injecting layer 33 and a hole transporting layer 31 formed between the luminescent layer 29 and the transparent electrode 35.

The metal electrode 23 is formed using a conductive substance such as Al, and used for supplying the scan pulse to the cells. The transparent electrode 35 is formed using a transparent conductive substance such as the ITO, and used for supplying the data to the cells. The electron injecting layer 25 supplies the electron provided from the metal electrode 23 to the electron transporting layer 27. The electron transporting layer 27 supplies the electron provided from the electron injecting layer 25 to the luminescent layer 29 after accelerating the electron. The hole injecting layer 33 supplies the hole provided from the transparent electrode to the hole transporting layer 31. And the hole transporting layer 31 supplies the hole provided from the hole injecting layer 33 after accelerating the hole.

After that, when the voltage is applied between the metal electrode 23 and the transparent electrode 35 from the outer side, the hole generated on the transparent electrode 35 is accelerated toward the metal electrode 23, and the electron generated on the metal electrode 23 is accelerated toward the transparent electrode 35. Therefore, the hole provided from the hole transporting layer 31 and the electron provided from the electron transporting layer 27 are crashed into each other on center portion of the luminescent layer 29, and thereby, the visible light is generated to display a predetermined image.

FIG. 3 is an exemplary view showing a general inorganic or organic EL matrix panel.

As shown therein, the inorganic or organic EL matrix panel comprises: pixel cells 1 and 21 located on crossed areas of data lines $D_1, D_2, \ldots, D_n$ and scan lines $S_1, S_2, \ldots, S_m$; a data driving unit 51 for supplying the data pulse to the data lines; a scan driving unit 41 for supplying the scan pulse to the scan lines; and a panel 61 on which the data lines, the scan lines, and the cells are installed.

The scan driving unit 41 supplies the scan pulse to the scan line in order. The data driving unit 51 supplies the data pulse synchronized with the scan pulse to the data line. At that time, the pixel cells 1 and 21 which receives the scan pulse and the data pulse are turned on when the voltage is larger than a threshold voltage which is set in advance, and turned off when the voltage is smaller than the threshold voltage. Therefore, the pixel cell displays the image by releasing the visible light corresponding to the inputted data pulse.

However, the above inorganic EL panel has a different threshold voltage of the phosphor due to the characteristics of the phosphor, that is, constructing the luminescent layer using the inorganic substance. Therefore, the inorganic EL panel may have problems such as lack of saturation, lack of brightness, and wrong discharge when the same driving voltage is applied in realizing the colors of red, green, and blue. Also, the blue color phosphor has a shorter life span than those of the red and green color phosphors, and has a lower brightness. Therefore, it is difficult to set the color balance in the inorganic EL panel due to the brightness lowering of the blue color phosphor.

On the other hand, the general organic EL panel needs high electric current when driving, and it is difficult to scale up due to chromaticity lowering according to temperature. Also, the red color phosphor in which the luminescent layer is constructed using the organic substance has shorter life span than those of the blue and green color phosphors, and has lower brightness. Therefore, it is difficult to set the color balance in the organic EL panel due to the brightness lowering of the red phosphor.

SUMMARY OF THE INVENTION

Therefore, an object of the present invention is to improve brightness by forming a cell constructing a panel larger than that of conventional art.

Another object of the present invention is to scale up a panel by forming the cell constructing the panel larger than that of conventional art, and by driving luminescent layers formed using inorganic substance and organic substance by different voltages from each other.

Still another object of the present invention is to increase a life span of a panel by forming a cell of phosphor using organic substance or inorganic substance having long life span.

Still another object of the present invention is to set color balance easily by improving brightness of blue color phosphor and of red color phosphor having relatively weak brightness by forming a cell constructing the panel larger than that of the conventional art, forming the cell in blue color phosphor using organic substance, and forming the cell in red color phosphor using inorganic substance.

To achieve these and other advantages and in accordance with the purpose of the present invention, as embodied and broadly described herein, there is provided a hybrid electro luminescence panel comprising: a first substrate having luminescent substance formed using organic substance and a second substrate having luminescent substance formed using inorganic substance, and displaying an image by overlapping image displaying surfaces of the first and second substrates.

To achieve above objects of the present invention, there is also provided a method for driving a hybrid electro luminescence panel comprising the steps of: forming luminescent substance formed by organic material on a first substrate as a matrix form; forming luminescent substance which is formed by inorganic material on a second substrate as a matrix form; installing the first substrate and the second substrate so that image displaying surfaces thereof can be overlapped with each other; and providing the first and second substrates with scan pulse and data pulse for displaying an image.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
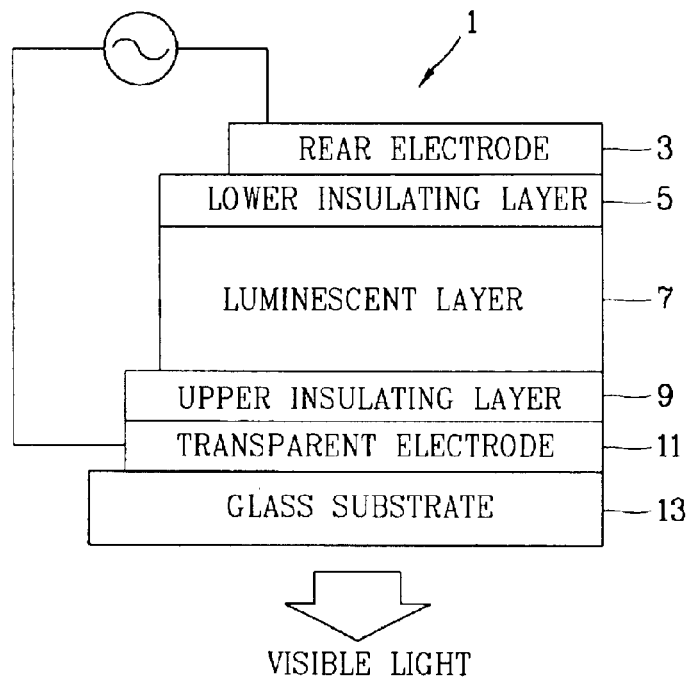
FIG. 1 is an exemplary view showing a cell structure of a general inorganic electro luminescence (EL) device.
Figure 2:
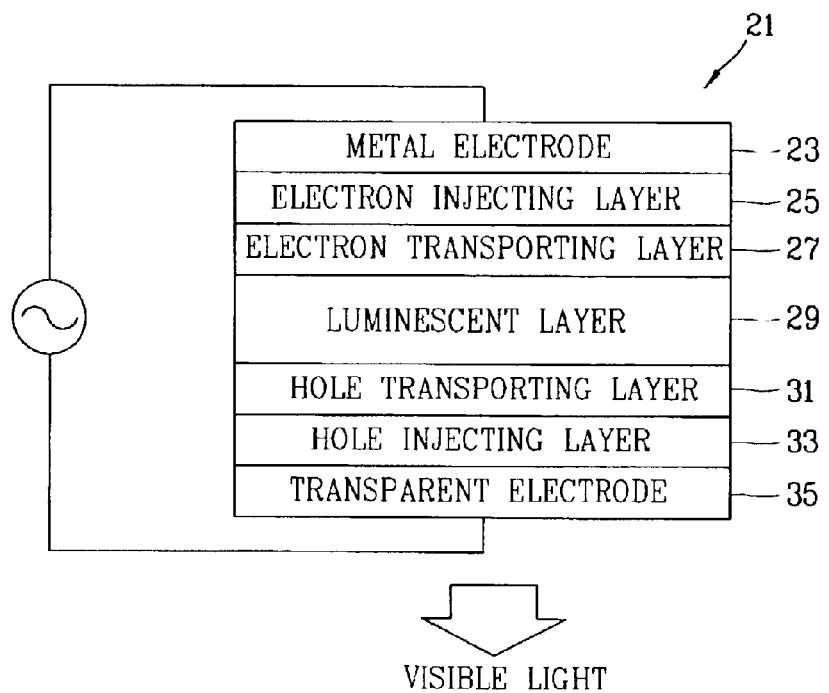
FIG. 2 is an exemplary view showing a cell structure of a general organic EL device.
Figure 3:
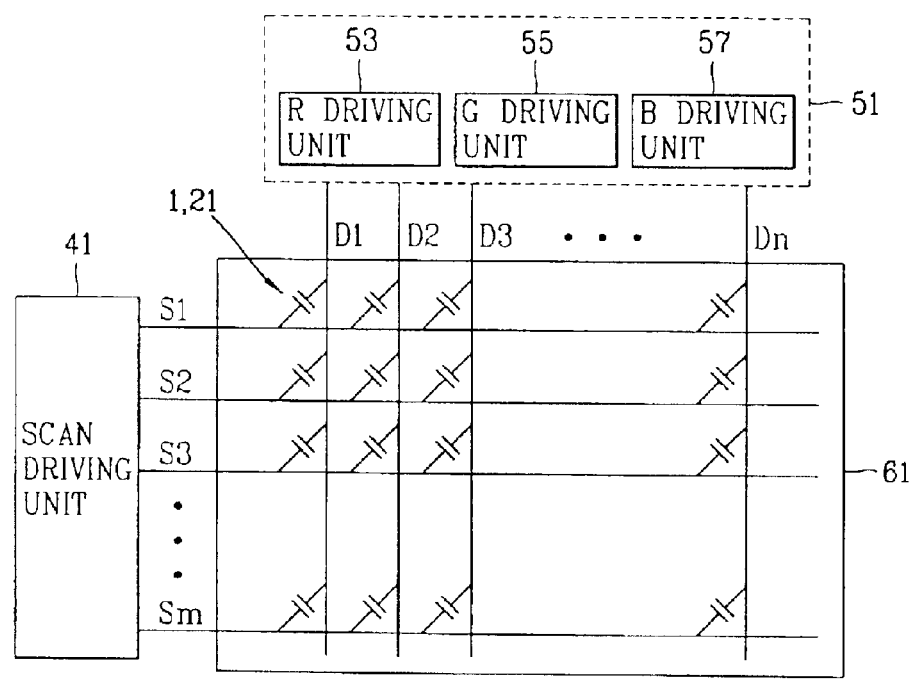
FIG. 3 is an exemplary view showing a general inorganic or organic EL matrix panel.
Figure 4:
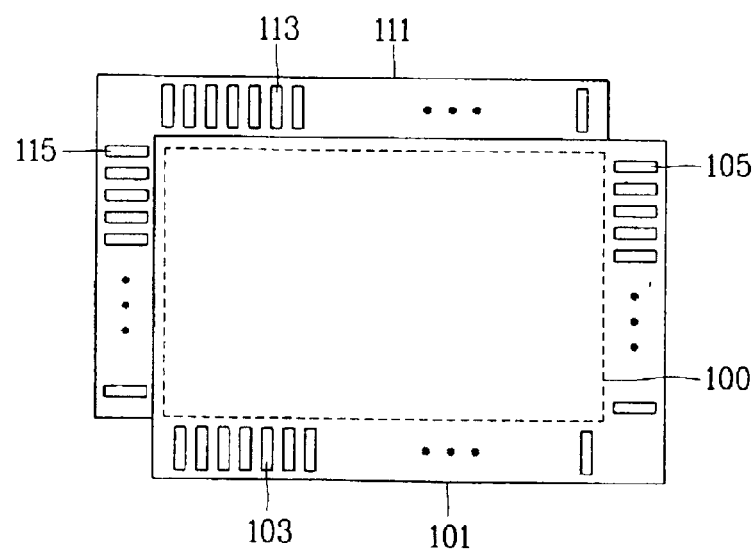
FIG. 4 is a view showing a hybrid EL panel according to a first embodiment of the present invention.

FIG. 4 is an exemplary view showing a hybrid electro luminescence (EL) panel according to a first embodiment of the present invention.

As shown therein, the hybrid EL panel comprises a first substrate 101 having a luminescence substance formed by organic material and a second substrate 111 having a luminescence substance formed by inorganic material, and displays an image by overlapping image displaying surface 100 of the first substrate 101 and of the second substrate 111. Also, the hybrid EL panel further comprises first~fourth pads 103, 105, 113, and 115 for electrically connecting to scan line and to data line on areas except the image displaying surface 100 of the first and second substrate 101 and 111.

Herein, the luminescent substance formed on the first substrate 101 is an organic substance having blue color property, and the luminescent substance formed on the second substrate 111 is an inorganic substance having red color property. However, the luminescent substance having green color property may be any of the inorganic and organic substances. Therefore, the luminescent substance having green color property can be formed on one of the first and second substrates 101 and 111. Herein, the inorganic substance having the green color property is formed on the second substrate 111 for convenience' sake. Therefore, blue color organic substances are formed as a matrix form on the first substrate 101 of the hybrid EL panel according to the present invention. Also, the red and green inorganic substances are formed on the second substrate 111 as a matrix form. However, in the conventional EL panel, red, green, and blue color luminescent substances are formed on one substrate. Therefore, the cell according to the present invention is formed larger than that of the conventional EL panel using the inorganic or organic substance.

Figure 5A:
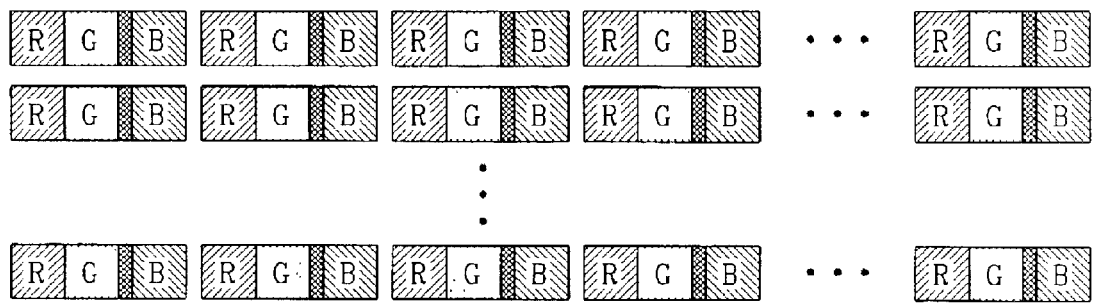
FIG. 5A is an exemplary view showing phosphor arrangement status of organic materials formed on a first substrate according to the present invention.
Figure 5B:
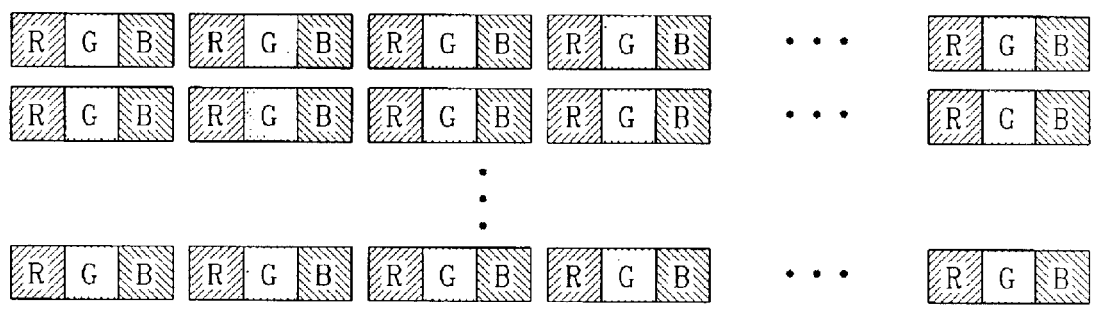
FIG. 5B is an exemplary view showing phosphor arrangement status of inorganic materials formed on a second substrate according to the present invention.

FIGS. 5A and 5B are exemplary views showing phosphor arrangement states of organic and inorganic substances formed on the first and second substrates 101 and 111 according to the present invention.

As shown in FIG. 5, the phosphor consisting of the red and green color inorganic substances and the blue color organic substance is formed to be larger than that of the conventional EL panel. Also, the red and the green color inorganic substances and the blue color organic substance are overlapped on the image displaying surface 100 flatly.

Therefore, the blue color organic substance and the green color inorganic substance may be arranged to be overlapped with each other, and the blue color organic substance and the red color inorganic substance may be arranged to be overlapped with each other. Also, the blue color organic substance may be arranged to be overlapped with the red and the green color inorganic substances. Herein, the red color inorganic substance, the green color inorganic substance, and the blue color organic substance make a pixel cell. On the other hand, the red and green color inorganic substances and the blue color organic substance may be arranged not to be overlapped with each other as shown in FIG. 5B.

In the hybrid EL panel according to the present invention, the blue color phosphor forms a cell with an organic substance, and the red color phosphor forms a cell with an inorganic substance, and thereby, the relatively weak brightness of the blue and red color phosphors can be improved. That is, the panel is formed using the first substrate 101 having the blue color organic substance having a higher life span and brightness than those of blue color inorganic substance, and using the second substrate 111 having the red color inorganic substance having a higher life span and brightness than those of red color organic substance. At that time, the first substrate 101 and the second substrate 111 are constructed to have a different voltage or current driving source when the panel is operated.

Figure 6:
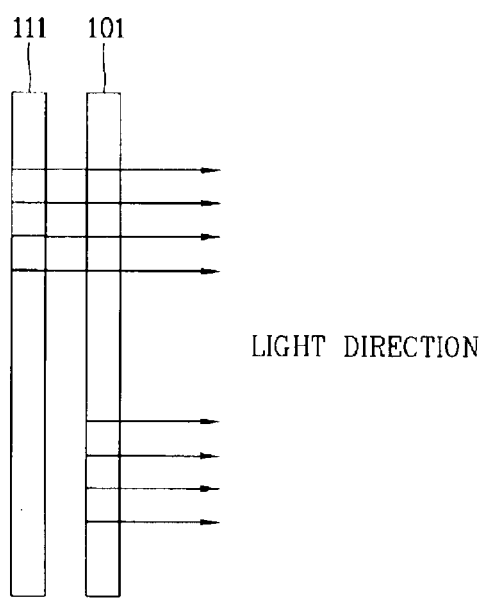
FIG. 6 is an exemplary view showing light generating direction of the hybrid EL panel according to the present invention.

FIG. 6 is an exemplary view showing a light generating direction in the hybrid EL panel according to the present invention.

As shown therein, in the hybrid EL panel according to the present invention, the light generated by emitting the blue, red, and green color phosphors is released to the outer side through the image displaying surface of the first and second substrates 101 and 111. At that time, the lights which are different according to luminescent strengths of the blue, red, and green color phosphors are released to the outer side to display various colors.

Figure 7:
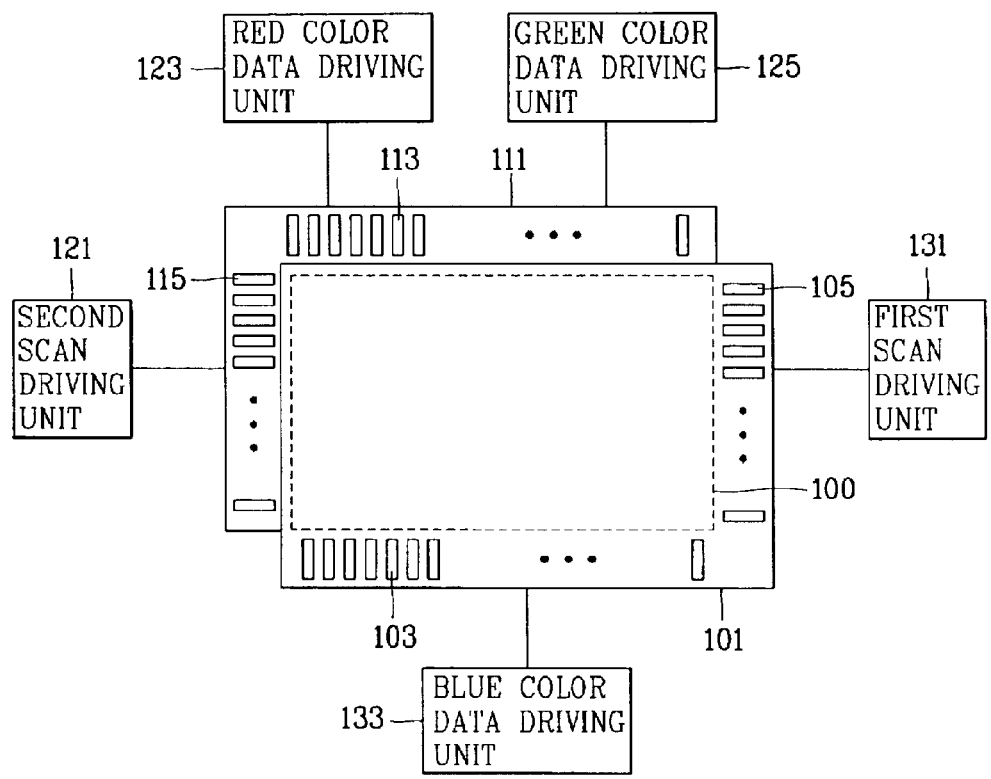
FIG. 7 is an exemplary view showing a scan driving unit and a data driving unit of the hybrid EL panel according to the present invention.

FIG. 7 is an exemplary view showing scan driving units 121 and 131 and data driving units 123, 125, and 133 of the hybrid EL panel according to the present invention.

As shown therein, the luminescent substance on the first substrate 101 of the hybrid EL panel is formed by the blue color organic substance. Also, the luminescent substance of the second substrate 111 is formed by the red and green color inorganic substances.

The first substrate 101 comprises a first pad 103 for electrically connecting to the data line, a blue color data driving unit 133 for supplying the data pulse through the first pad 103, a second pad 105 for electrically connecting to the scan line, and a first scan driving unit 131 for supplying the scan pulse through the second pad 105.

The second substrate 111 comprises a third pad 113 for electrically connecting to the data line, a red color data driving unit 123 for supplying the data pulse to the red inorganic substance through the third pad 113, a green color data driving unit 125 for supplying the data pulse to the green color inorganic substance through the third pad 113, a fourth pad 115 for electrically connecting to the scan line; and a second scan driving unit 121 for supplying the scan pulse to the fourth pad 115.

A method for driving the hybrid EL panel having above structures according to the present invention will be described as follows.

The luminescent substances formed with the organic substances are formed on the first substrate 101 as a matrix form, and the luminescent substances formed with the inorganic substances are formed on the second substrate 111 as a matrix form. In addition, the image displaying surface 100 of the first and second substrates 101 and 111 is formed to be overlapped, and the scan pulse and the data pulse for displaying the image are provided to the first and second substrates 101 and 111 to operate the panel.

The above will be described in more detail as follows.

The first and second scan driving units 131 and 121, and the blue, red, and green color data driving units 133, 123, and 125 provides the luminescent substances of the first substrate 101 and the luminescent substances of the second substrate 111 with the scan pulse and the data pulse. Therefore, the luminescent substances formed on the first and second substrates 101 and 111 emit the light corresponding to the data pulse. Herein, the scan pulse provided from the first scan driving unit 131 is synchronized with the scan pulse provided from the second scan driving unit 121. That is, when the scan pulse is provided to the scan line from the second scan driving unit 121, the first scan driving unit 131 also provides the scan line with the scan pulse.

Figure 8:
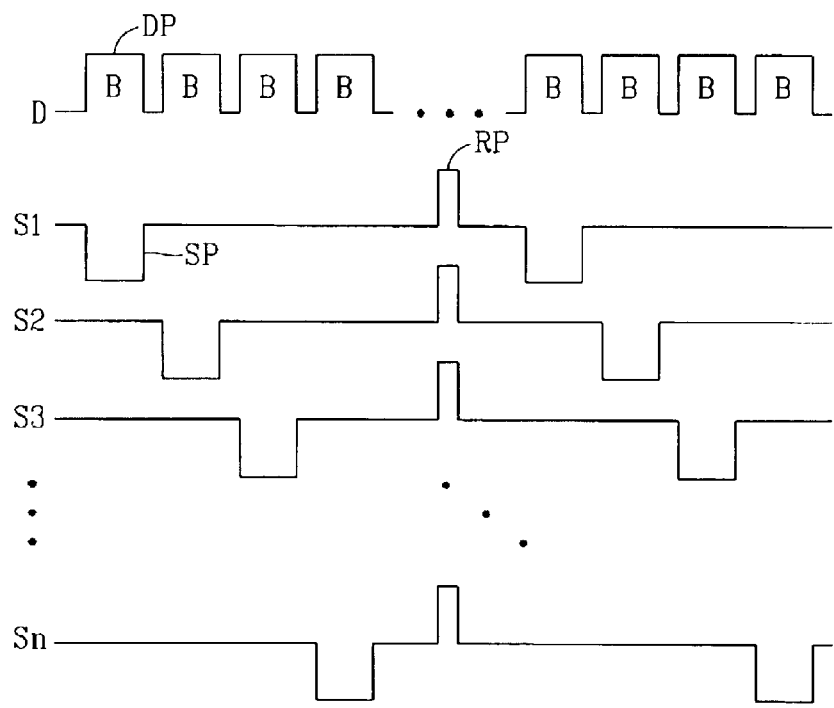
FIG. 8 is a waveform diagram showing a driving waveform applied to the first substrate according to the present invention.

FIG. 8 is a waveform diagram showing a driving waveform applied to the first substrate according to the present invention.

The first scan driving unit 131 provides the second pad 105 formed on the first substrate (organic EL) with the scan pulse sequentially.

After that, the scan pulse (SP) provided from the first scan driving unit 131 is sequentially provided to the scan line which is formed to be overlapped with the blue color organic substance formed on the first substrate 101. Herein, the scan pulse provided from the first scan driving unit 131 has negative polarity. Also, the first scan driving unit 131 supplies refresh pulse (RP) after the scan pulse is supplied to the scan line in order to remove electric charges charged in the cell.

The blue color data driving unit 133 provides the first pad 103 connected to the blue color organic substance with the data pulse (DP) synchronized with the scan pulse. The data pulse provided to the first pad 103 is supplied to the data line after passing through the first pad 103.

Figure 9:
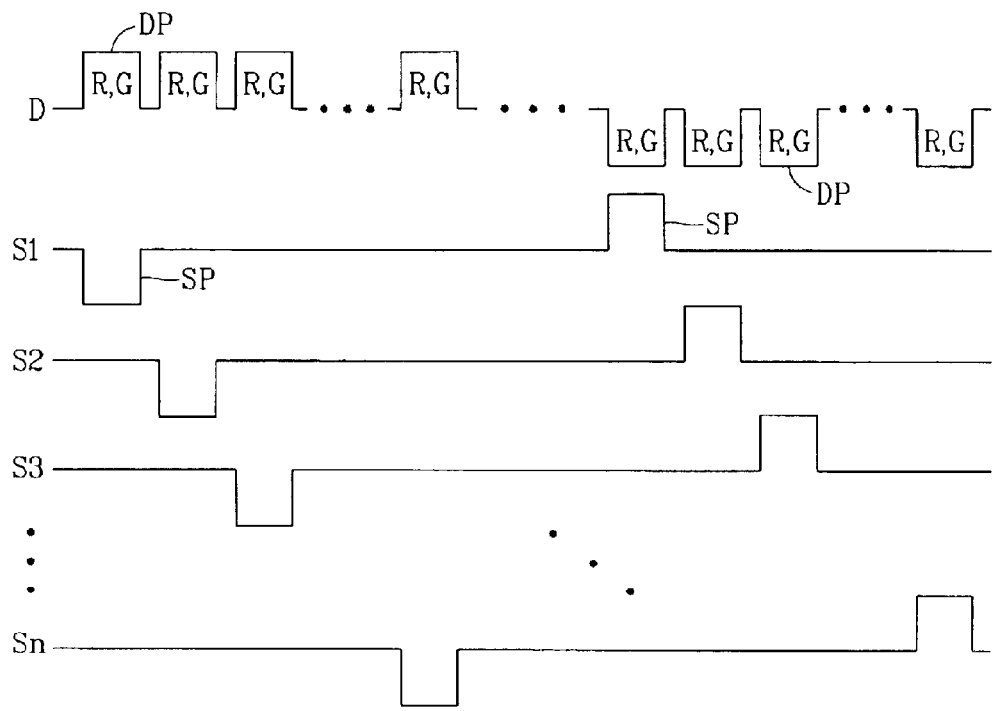
FIG. 9 is a waveform diagram showing a driving waveform applied to the second substrate according to the present invention.

FIG. 9 is a waveform diagram showing a driving waveform applied to the second substrate according to the present invention.

The second scan driving unit 121 provides the fourth pad 115 formed on the second substrate (inorganic EL) 111 with the scan pulse sequentially. The scan pulse is provided sequentially to the scan line which is formed to be overlapped with the red, and green color inorganic substances formed on the second substrate 111.

The red color data driving unit 123 provides the third pad 113 which is connected to the red color inorganic substance with the data pulse synchronized with the scan pulse. The data pulse supplied to the third pad 113 is supplied to the data line after passing through the third pad 113.

The green color data driving unit 125 provides the third pad 113 connected to the green color inorganic substance with the data pulse which is synchronized with the scan pulse. The data pulse supplied to the third pad 113 is supplied to the data line after passing through the third pad 113.

Herein, the scan pulse and the data pulse are reversed at every frame. That is, in order to prevent the red and green color luminescent substances formed with the inorganic substances from being damaged, the scan pulse and the data pulse are supplied to the scan line and the data line as reversed at every frame.

Figure 10:
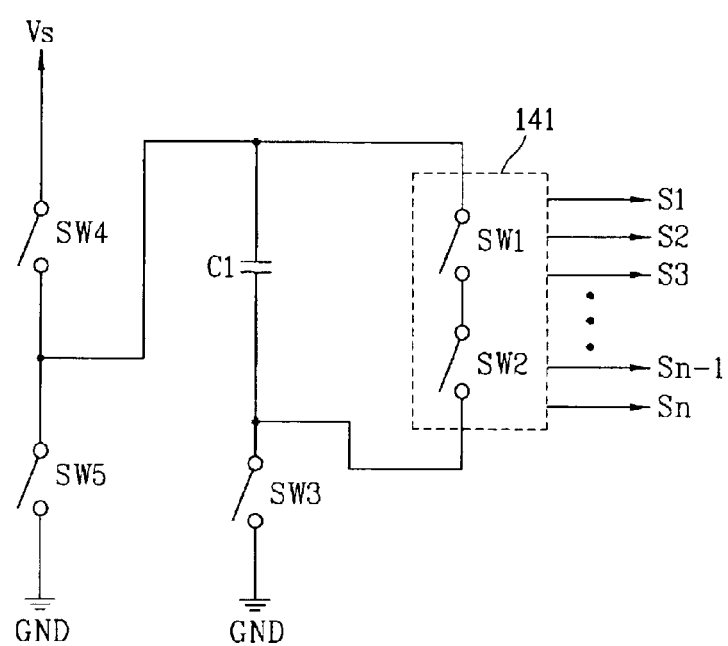
FIG. 10 is a circuit diagram showing the scan driving unit in FIG. 7 in detail.

FIG. 10 is a circuit diagram showing the scan driving unit in FIG. 7 in detail.

As shown therein, the second scan driving unit 121 of the second substrate (inorganic EL) comprises: a scan driving integrated circuit (IC) 141 for selecting the scan line; a fourth switch (Sw4) installed between the scan drive IC 141 and a scan voltage source (Vs); a fifth switch installed between the fourth switch (Sw4) and a basic voltage source (GND); a capacitor (C1) installed on the scan drive IC 141 in a row; and a third switch (Sw3) installed between the capacitor C1 and the basic voltage source (GND).

Herein, a plurality of scan lines S1 through Sn are connected to the scan drive IC 141. That is, first and second switches are installed on respective scan lines S1 through Sn. The switches (Sw1, Sw2, Sw3, Sw4, Sw5) are operated by control signals provided from a controller (not shown).

Operation of the second scan driving unit 121 constructed as above according to the present invention will be described as follows.

The third and fourth switches Sw3 and Sw4 are turned on by the control signal provided from the controller. When the third and fourth switches Sw3 and Sw4 are turned on, the voltage of the scan voltage source Vs is charged in the capacitor C1. The voltage charged in the capacitor C1 is supplied to the scan drive IC 141, and the scan drive IC 141 supplies the scan pulses to the scan lines S1 through Sn sequentially. At that time, positive scan pulses are provided to the scan lines S1 through Sn.

After that, after the fourth switch Sw4 and the third switch Sw3 are turned off, the fifth switch Sw5 is turned on. When the fifth switch Sw5 is turned on, the voltage charged in the capacitor C1 is reversed into negative voltage. In other words, when only the fifth switch Sw5 is turned on, one side end of the capacitor C1 is connected to the basic voltage source (GND), and another side end is maintained in a floating status. That is, the voltage charged in the capacitor C1 can not be discharged, and the voltage of the basic voltage source is also lowered.

After that, the negative voltage charged in the capacitor C1 is supplied to the scan drive IC 141, and the scan drive IC 141 provides the scan lines S1 through Sn with the scan pulses sequentially. At that time, the negative scan pulses are provided to the scan lines S1 through Sn. Therefore, the second scan driving unit 121 provides the fourth pad 115 with the scan pulse (SP) which is reversed at every frame.

Figure 11:
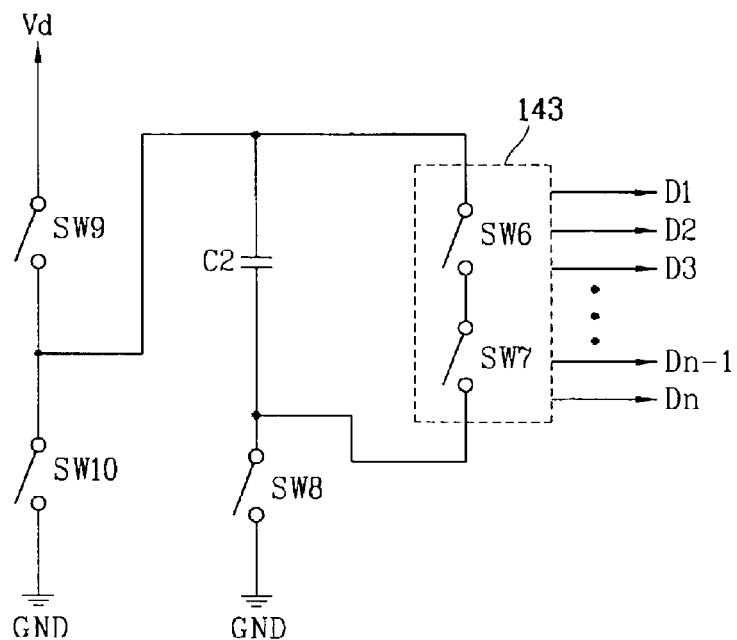
FIG. 11 is a circuit diagram showing the data driving unit in FIG. 7 in detail.

FIG. 11 is a circuit diagram showing the data driving units in FIG. 7 in detail.

As shown therein, the data driving units 123 and 125 of the second substrate (inorganic EL) 111 comprise: a data drive IC 143 for selecting the data line; a ninth switch Sw9 installed between the data drive IC 143 and a data voltage source Vd; a tenth switch Sw10 installed between the ninth switch Sw9 and a basic voltage source GND; a capacitor C2 installed on the data drive IC 143 in a row; and a eighth switch Sw8 installed between the capacitor C2 and the basic voltage source GND.

Herein, the data drive IC 143 is connected to a plurality of data lines D1 through Dn. That is, sixth and seventh switches Sw6 and Sw7 are installed on respective data lines D1 through Dn. Therefore, the data drive IC 143 connects the data lines to the capacitor C2 according to data existence, and activates the data lines D1 through Dn. Herein, the data driving units 123 and 125 provides the data lines D1 through Dn with positive data pulses when the negative scan pulses are provided to the scan lines, and provides the data lines D1 through Dn with negative data pulses (DP) when the positive scan pulses are provided to the scan lines. Also, the switches Sw6, Sw7, Sw8, Sw9, and Sw10 are operated by control signals provided from a controller (not shown). The operational processes of the data driving units 123 and 125 are same as those of the scan driving unit 121 which is described above.

On the other hand, as the first scan driving unit 131 and the blue color data driving unit 133 connected to the first substrate 101, the driving units which are generally used at present. For example, the first scan driving unit 131 can be constructed as follows.

Figure 12:
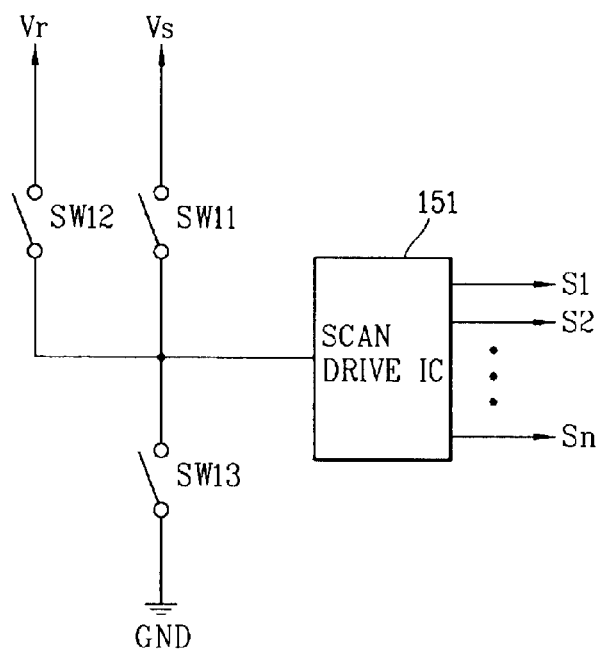
FIG. 12 is a circuit diagram showing the scan driving unit according to the present invention.

FIG. 12 is a circuit diagram showing the scan driving unit according to the present invention.

As shown therein, the scan driving unit 131 of the first substrate (organic lo EL) comprises: an eleventh switch Sw11 connected between the scan voltage source Vs and the scan line; a thirteenth switch Sw13 connected between the basic voltage source GND and the scan line; a twelfth switch Sw12 connected between a refresh voltage source Vr and the scan line; and a scan drive IC 151 for driving the scan lines S1 through Sn sequentially.

Operations of the scan driving unit 131 on the first substrate (organic EL) 101 according to above structure will be described as follows.

The eleventh, twelfth, and the thirteenth switches Sw11, Sw12, and Sw13 are turned on by the control signal provided from a controller (not shown). When the eleventh switch Sw11 is turned on, the voltage of the scan voltage source Vs is supplied to the scan line. At that lime, the scan pulse shown in FIG. 8 is supplied to the scan line. After the scan pulse is supplied for a predetermined time, the eleventh switch Sw11 is turned off, at that same time, the thirteenth switch Sw13 is turned on. When the thirteenth switch Sw13 is turned on, the voltage of the basic voltage source GND is supplied to the scan line.

After that, after the scan pulses are supplied to all scan lines S1 through Sn, the twelfth switch Sw12 is turned on. When the twelfth switch Sw12 is turned on, the voltage of the refresh voltage source Vr is supplied to the scan line. At that time, refresh pulses are supplied to the scan line. Therefore, the scan drive IC 151 repeats the above series of processes to provide the scan line with the scan pulse.

Figure 13:
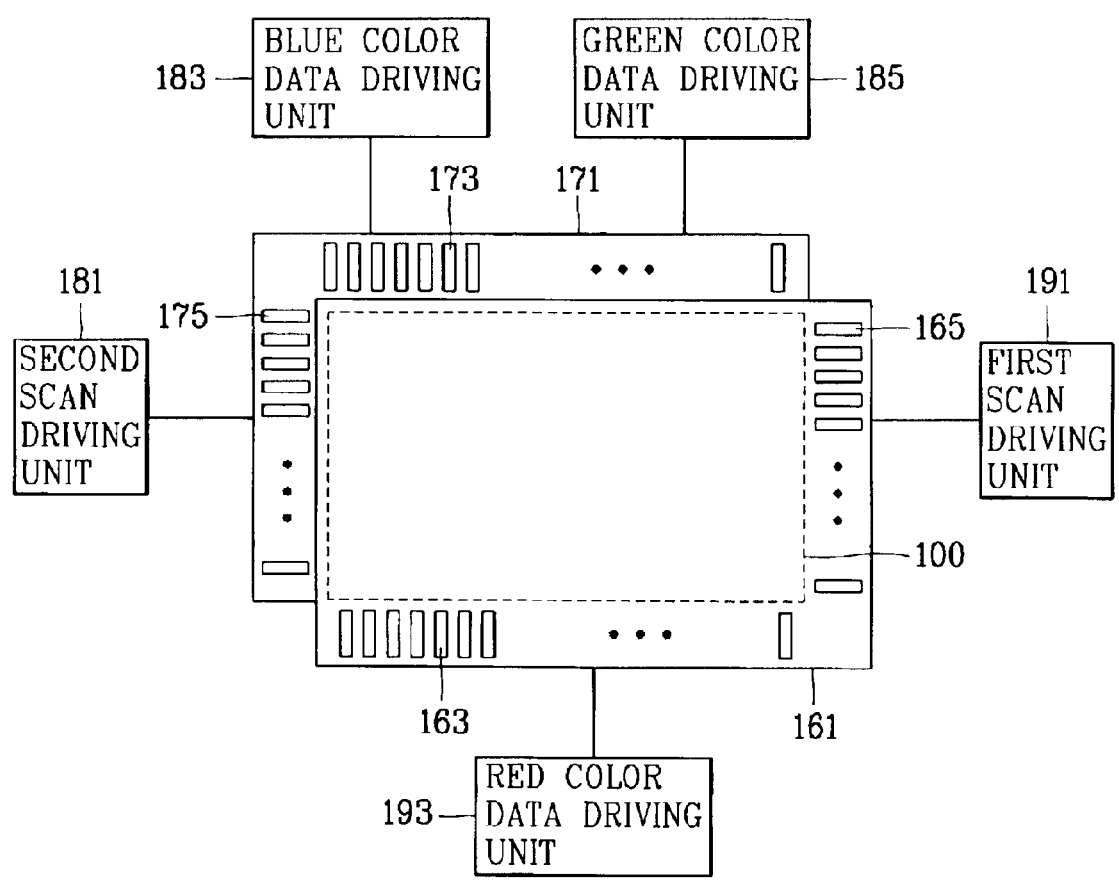
FIG. 13 is an exemplary view showing a hybrid EL panel according to a second embodiment of the present invention.

FIG. 13 is an exemplary view showing the hybrid EL panel according to a second embodiment of the present invention.

As shown therein, the hybrid EL panel comprises: a first substrate 161 having a plurality of red color inorganic substances which are arranged on an image displaying surface 100 for displaying the image as a matrix form; a first scan driving unit 191 for providing the first substrate 161 with scan pulses; a red data driving unit 193 for providing the first substrate 161 with data pulses; a second substrate 171 on which a plurality of blue color organic substances are formed to be overlapped with the image displaying surface 100; a second scan driving unit 181 for providing the second substrate 171 with scan pulses; and a blue and green color data driving units 183 and 185 for providing the second substrate 171 with the data pulses.

Herein, the panel according to the present invention may be formed so that the first substrate 161 includes the luminescent substance of inorganic material having green color property, and may be formed so that the second substrate 171 includes the luminescent substance of organic material having green color property. For example, in the present invention, the first substrate 161 is formed with the red color inorganic substance, and the second substrate 171 is formed with the green and blue color organic substances for convenience' sake.

On the other hand, as described in the first embodiment of the present invention, the hybrid EL panel comprises the scan line and the data line (not shown in Figure) for providing the inorganic or organic luminescent substances, which realize the red, green, and blue colors, with driving signals. That is, these are the data line formed on the first substrate 161 for providing the red color inorganic substance with the driving signal, the scan line formed on the first substrate 161 toward the direction of crossing above data line, the data line formed on the second substrate 171 for supplying the driving signal to the blue color organic substance and to the green color organic substance, and the scan line formed on the second substrate 171 toward the direction of crossing the above data line.

The scan driving units 181 and 191, and the data driving units 183, 185, and 193 are operated by same principles as those of the first embodiment for operating the EL panel. That is, the first scan driving unit 191 which supplies the scan pulse to the first substrate 161 supplies the scan pulse of which the polarity is reversed at every frame to the scan line, and the blue and green color data driving units 183 and 185 which supply the data pulse to the first substrate 161 supply the data pulse having different polarity from that of the scan pulse to the data line. That is, the scan pulse and the data pulse are reversed at every frame in order to prevent the luminescent substance which is formed by inorganic substance from being damaged, and supplied to the pads 163, 165, 173, and 175.

Also, the second scan driving unit 181 which supplies the scan pulse to the second substrate 171 supplies the refresh pulse for removing the scan pulse having negative polarity and the electric charges charged in the cell to the scan line. In addition, the blue and green data driving units 183 and 185 which supply the data pulse to the second substrate 171 supply positive data pulse to the data line when the negative scan pulse is supplied to the scan line, and supply negative data pulse to the data line when the positive scan pulse is supplied to the scan line.

As described in the second embodiment of the present invention, the red color inorganic substance of the first substrate 161 has longer life span and higher brightness than those of the red organic substance, and the blue color organic substance of the second substrate 171 has longer life span and higher brightness than those of the blue color inorganic substance. Also, in driving, the first substrate 161 consisting the inorganic substances and the second substrate 171 consisting the organic substances are constructed to have separated circuits. Therefore, according to the present invention, the problems caused when the red, green, and blue colors are realized using one panel in the conventional art can be solved, the panel can be scaled up easily, and the objects such as long life span, easy setting of color balance can be achieved.

As described above, according to the hybrid EL panel of the present invention, two panels are constructed using the advantages of the blue color organic substance and the red color inorganic substance, and thereby, the size of cell constructing the panel is increased, and therefore, the brightness can be improved. Since the size of the cell constructing the panel is increased, and the luminescent layers consisting the organic substance and inorganic substance are operated by different voltages from each other when operating the panel, the panel can be scaled up. In addition, the organic substance or the inorganic substance having long life span is used to form the cell of the luminescent layer, and thereby, the life span of the panel can be increased. The size of the cell constructing the panel is larger than that of the conventional art, the cell of the blue color phosphor is formed using the organic substance, and the cell of the red color phosphor is formed using the inorganic substance, and thereby, the relatively weak brightness of the blue color phosphor and the red color phosphor can be improved, and the color balance can be set easily.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A hybrid electro luminescence (EL) panel comprising:
a first substrate having a luminescent substance formed using an organic substance; and
a second substrate having a luminescent substance formed using an inorganic substance,
wherein the first substrate is configured to be driven using a first voltage or current and the second substrate is configured to be driven using a second voltage or current that is different from the first voltage or current,
wherein image displaying surfaces of the first substrate and the second substrate are overlapped with each other, and
wherein the first substrate comprises a blue color data driving unit for supplying data pulses and a first scan driving unit for supplying scan pulses, and the second substrate comprises a red color data driving unit for supplying data pulses, a green color data driving unit for supplying data pulses, and a second scan driving unit for supplying scan pulses.

2. The panel of claim 1, wherein the luminescent substance formed on the first substrate is an organic substance having a blue color property, and the luminescent substance formed on the second substrate is an inorganic substance having a red color property.

3. The panel of claim 2 further comprising a luminescent substance having a green color property on one of the first substrate and the second substrate.

4. The panel of claim 3, wherein the luminescent substance having the green color property is an organic substance or an inorganic substance.

5. The panel of claim 1, wherein the first substrate includes a blue color organic substance formed as a matrix form, and the second substrate includes red and green color inorganic substances formed as a matrix form.

6. The panel of claim 5, wherein the blue color organic substance is arranged to be overlapped with the green color inorganic substance, or the blue color organic substance is arranged to be overlapped with the red color inorganic substance.

7. The panel of claim 5, wherein the blue color organic substance is arranged with the red and green color inorganic substances.

8. The panel of claim 5, wherein the blue color organic substance is arranged not to be overlapped with the red and green color inorganic substances.

9. The panel of claim 5, wherein the red color inorganic substance, the green color inorganic substance, and the blue color organic substance make a pixel cell.

10. The panel of claim 1, wherein a plurality of data lines and scan lines are formed on the first substrate and on the second substrate, and an image is displayed by luminescence of a cell formed on a crossed portion of the data line and the scan line.

11. The panel of claim 10, wherein the first substrate and the second substrate include pads for electrically connecting to a signal inputted from an outer side on an area except the image displaying surface.

12. The panel of claim 11 further comprising a data driving unit for supplying data pulses and a scan driving unit for supplying scan pulses through the pads formed on the first and second substrates.

13. The panel of claim 12 further comprising a controller for outputting control signals to the data driving unit and to the scan driving unit.

14. The panel of claim 10, wherein the first substrate further comprises:
a first pad for electrically connecting to the data line; and
a second pad for electrically connecting with the scan line,
wherein the blue color data driving unit supplies the data pulses through the first pad, and
the first scan driving unit supplies the scan pulses through the second pad.

15. The panel of claim 14, wherein the first scan driving unit comprises: an eleventh switch connected between a scan voltage source and a scan line; a thirteenth switch connected between a basic voltage source GND and the scan line;
a twelfth switch connected between a refresh voltage source and the scan line; and
a scan drive integrated circuit (IC) for driving the scan line sequentially.

16. The panel of claim 10, wherein the second substrate further comprises:
a third pad for electrically connecting to the data line; and
a fourth pad for electrically connecting to the scan line,
wherein the red color data driving unit supplying the data pulses through the third pad, the green color driving unit supplies the data pulses through the third pad, and the second scan driving unit supplies the scan pulses to the fourth pad.

17. The panel of claim 16, wherein the second scan driving unit comprises a scan drive IC for selecting the scan line, a fourth switch installed between the scan drive IC and a scan voltage source Vs, a fifth switch installed between the fourth switch and a basic voltage source GND, a capacitor C1 installed on the scan drive IC in a row, and a third switch installed between the capacitor C1 and the basic voltage source GND.

18. The panel of claim 17, wherein the scan drive IC is connected to a plurality of scan lines.

19. The panel of claim 16, wherein the red and green color data driving units comprise a data drive IC for selecting the data line, a ninth switch installed between the data drive IC and a data voltage source Vd, a tenth switch installed between the ninth switch and a basic voltage source GND, a capacitor C2 installed on the data drive IC in a row, and an eighth switch installed between the capacitor C2 and the basic voltage source.

20. The panel of claim 16, wherein the red and green color data driving units supply a positive data pulse to the data line when a negative scan pulse is supplied to the scan line, and supply a negative data pulse to the data line when a positive scan pulse is supplied to the scan line.

21. A hybrid EL (electro luminescence) panel comprising:
a first substrate having a plurality of red color inorganic substances formed on an image displaying surface as a matrix form;
a scan driving unit for providing the first substrate with scan pulses;
a data driving unit for providing the first substrate with data pulses;
a second substrate having a plurality of blue color organic substances formed as a matrix form so as to be overlapped with the image displaying surface;
a scan driving unit for providing the second substrate with the scan pulses; and
a data driving unit for providing the second substrate with the data pulses.

22. The panel of claim 21, wherein a luminescent substance of an inorganic material having a green color property is formed on the first substrate, or a luminescent substance of an organic material having a green color property is formed on the second substrate.

23. The panel of claim 22 further comprising a data line formed on the first substrate for supplying a driving signal to the red color inorganic substance, a scan line formed on the first substrate toward a direction of crossing the data line formed on the first substrate, a data line formed on the second substrate for supplying a driving signal to the blue color organic substance and to the green color organic substance, and a scan line formed on the second substrate toward a direction of crossing the data line formed on the second substrate.

24. The panel of claim 23, wherein the scan driving unit supplying the scan pulses to the first substrate supplies the scan pulses of which a polarity is reversed at every frame to the scan line, and the data driving unit supplying the data pulses to the first substrate supplies the data pulses having different polarity from that of the scan pulses to the data line.

25. The panel of claim 23, wherein the scan driving unit supplying the scan pulses to the second substrate supplies a refresh pulse for removing the scan pulses having a negative polarity and electric charges charged in a cell to the scan line, and the data driving unit supplying the data pulses to the second substrate supplies positive data pulses to the data line when a negative scan pulses is supplied to the scan line and supplies negative data pulses to the data line when the scan pulses having a positive polarity is supplied to the scan line.

26. A method for forming a hybrid EL (electro luminescence) panel comprising:

forming a luminescent substance formed with an organic substance on a first substrate as a matrix form;

forming a luminescent substance formed with an inorganic substance on a second substrate as a matrix form;

installing the first substrate and the second substrate so that image displaying surfaces can be overlapped; and providing the first substrate and the second substrate with scan pulses from a scan driving unit and data pulses from a data driving unit, respectively, for displaying an image, wherein the scan driving unit supplies the scan pulses sequentially to the scan lines formed on the first substrate to be overlapped with the organic substance, and to the scan lines formed on the second substrate to be overlapped with the inorganic substance when supplying the scan pulses, and wherein the first substrate is supplied the scan pulses having a negative polarity from the scan driving unit.

27. The method of claim 26, wherein a cell is formed so as to display the image by overlapping the luminescent substance of an organic material with the luminescent substance of an inorganic material, or the cell is formed so that the luminescent substance of the organic material is not overlapped with the luminescent substance of the inorganic material to display the image.

28. The method of claim 26, wherein the luminescent substance formed by the organic substance is an organic substance having a blue color luminous property, and the luminescent substance formed with the inorganic substance is an inorganic substance having a red color luminous property.

29. The method of claim 28, wherein the luminescent substance further comprises an organic substance or inorganic substance having a green color luminous property.

30. The method of claim 26, wherein the step of providing the scan pulse and the data pulses comprises:

forming pads for electrically connecting to an outer side on the first and second substrates;

supplying the data pulses to the first and second substrates through the pads from a data driving unit; and supplying the scan pulses to the first and second substrates through the pads from a the scan driving unit.

31. The method of claim 30, wherein the scan driving unit supplies a refresh pulse for removing electric charges charged in a cell after the scan pulses are supplied to the scan lines.

32. The method of claim 30, wherein the scan pulses supplied to the second substrate are synchronized with the scan pulses supplied to the first substrate when supplying the scan pulses.

33. The method of claim 30, wherein the data driving unit supplies the data pulses synchronized with the scan pulses to the pad connected to the organic substance formed on the first substrate, or supplies the data pulses synchronized with the scan pulses to the pad connected to the inorganic substance formed on the second substrate, when supplying the scan pulses and the data pulses.

34. The method of claim 30, wherein the scan driving unit supplying the scan pulses to the first substrate supplies refresh pulses for removing the negative scan pulses and the electric charges charged in the cell to the scan line, and the data driving unit supplying the data pulses to the first substrate supplies a positive data pulse to the data line when the scan pulses of negative polarity are supplied to the scan line and supplies a negative data pulse to the data line when the scan pulses of positive polarity are supplied to the scan line, in the step of supplying the scan pulses and the data pulses.

35. The method of claim 30, wherein the scan driving unit supplying the scan pulses to the second substrate supplies the scan pulses of which polarity is reversed at every frame to the scan line, and the data driving unit supplying the data pulses to the second substrate supplies the data pulses having a different polarity from that of the scan pulses to the data line, when supplying the scan pulses and the data pulses.

36. A hybrid electro luminescence (EL) panel comprising:

a first substrate having a luminescent substance formed using an organic substance having a first color property;

a second substrate having a luminescent substance formed using an inorganic substance having a second color property;

a first scan driving unit configured to supply scan pulses to the first substrate; and a second scan driving unit that is separate from the first scan driving unit and configured to supply scan pulses to the second substrate, wherein image displaying surfaces of the first substrate and the second substrate are overlapped with each other.

37. The panel of claim 36, further comprising:

a driving source configured to drive the first substrate using a first voltage or current and to drive the second substrate using a second voltage or current that is different from the first voltage or current.

38. The panel of claim 36, wherein the first color property is a blue color property, and the second color property is a red color property.

39. The panel of claim 36 further comprising a luminescent substance having a green color property on one of the first substrate and the second substrate.

40. The panel of claim 36 further comprising:

a first data driving unit configured to supply data pulses to the first substrate; and a second data driving unit that is separate from the first data driving unit and configured to supply data pulses to the second substrate.

* * * * *